(12) United States Patent
Yun et al.

(10) Patent No.: US 12,076,832 B2
(45) Date of Patent: Sep. 3, 2024

(54) POLISHING PAD WITH IMPROVED CROSSLINKING DENSITY AND PROCESS FOR PREPARING THE SAME

(71) Applicant: SKC solmics Co., Ltd., Gyeonggi-do (KR)

(72) Inventors: Jong Wook Yun, Gyeonggi-do (KR); Eun Sun Joeng, Ulsan (KR); Hye Young Heo, Gyeonggi-do (KR); Jang Won Seo, Gyeonggi-do (KR)

(73) Assignee: SK ENPULSE CO., LTD., Gyeonggi-Do (KR)

( * ) Notice: Subject to any disclaimer, the term of this patent is extended or adjusted under 35 U.S.C. 154(b) by 1018 days.

(21) Appl. No.: 16/791,881

(22) Filed: Feb. 14, 2020

(65) Prior Publication Data

US 2020/0368873 A1  Nov. 26, 2020

(30) Foreign Application Priority Data

May 21, 2019 (KR) .......................... 10-2019-0059632

(51) Int. Cl.
*B24B 37/24* (2012.01)
*B24B 7/22* (2006.01)
(Continued)

(52) U.S. Cl.
CPC .............. *B24B 37/24* (2013.01); *B24B 7/228* (2013.01); *B24D 11/00* (2013.01); *C08J 9/12* (2013.01);
(Continued)

(58) Field of Classification Search
CPC ......... B24B 37/24; B24B 7/228; B24D 11/00; C08G 18/12; C08G 18/3206; C08G 18/3243; C08G 18/4854; C08G 18/6529; C08G 18/6685; C08G 18/724; C08G 18/758; C08G 18/7621; C08J 2201/026; C08J 2203/06; C08J 2203/22; C08J 2375/04; C08J 9/12; C08J 9/122;
(Continued)

(56) References Cited

U.S. PATENT DOCUMENTS

2010/0048102 A1* 2/2010 Nakai ................... B24B 37/24
451/41

FOREIGN PATENT DOCUMENTS

CN 104385120 A 3/2015
KR 10-0236499 B1 1/2000
(Continued)

OTHER PUBLICATIONS

Office Action issued by Korean Patent Office on Jul. 20, 2020.
(Continued)

*Primary Examiner* — Shuangyi Abu Ali
(74) *Attorney, Agent, or Firm* — IP & T GROUP LLP

(57) ABSTRACT

The present invention provides a polishing pad whose crosslinking density is adjusted to enhance the performance of the CMP process such as polishing rate and cut pad rate. In addition, in the process for preparing a polishing pad according to the embodiment, it is possible to implement such a crosslinking density by a simple method of controlling the preheating temperature of the mold for curing. Thus, the polishing pad may be applied to a process of preparing a semiconductor device, which comprises a CMP process, to provide a semiconductor device such as a wafer of excellent quality.

10 Claims, 5 Drawing Sheets

(51) Int. Cl.
  *B24D 11/00*    (2006.01)
  *C08J 9/12*     (2006.01)
  *H01L 21/306*   (2006.01)

(52) U.S. Cl.
  CPC ..... *H01L 21/30625* (2013.01); *C08J 2375/04* (2013.01)

(58) Field of Classification Search
  CPC ......... C08J 9/146; C08J 9/32; G03F 7/70475; H01L 21/30625; H01L 21/31053
  See application file for complete search history.

(56) References Cited

FOREIGN PATENT DOCUMENTS

| | | |
|---|---|---|
| KR | 10-2009-0036147 A | 4/2009 |
| KR | 10-1360654 B1 | 2/2014 |
| KR | 10-2016-0027075 | 3/2016 |
| KR | 10-1853021 B1 | 4/2018 |
| KR | 10-2019-0029473 A1 | 3/2019 |
| TW | 201332716 A1 | 8/2013 |

OTHER PUBLICATIONS

Office Action issued by the Chinese Patent Office on Nov. 3, 2021.
1 Office Action issued by the Taiwanese Patent Office on Jan. 21, 2022.

\* cited by examiner

[Fig. 1a]
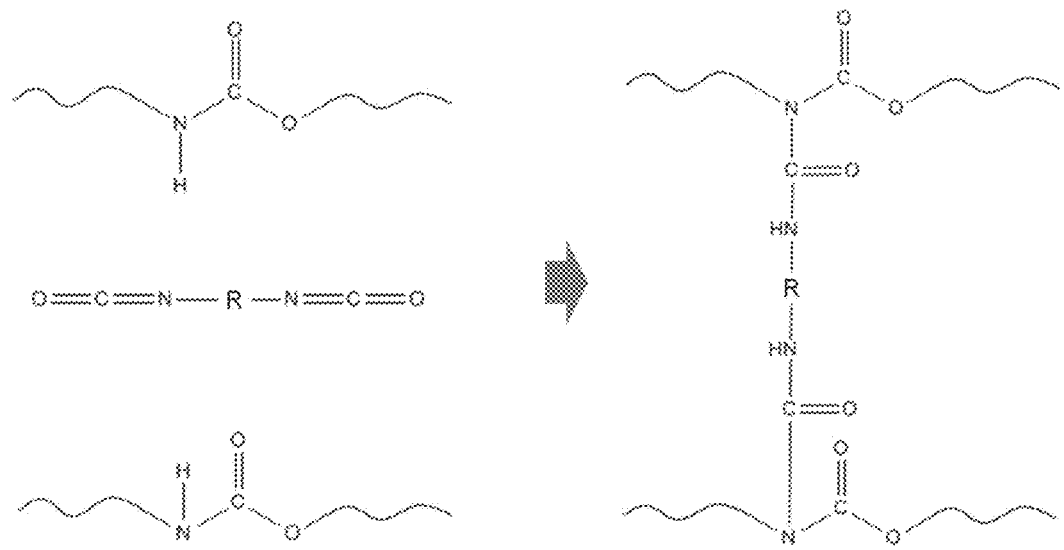
[Fig. 1b]
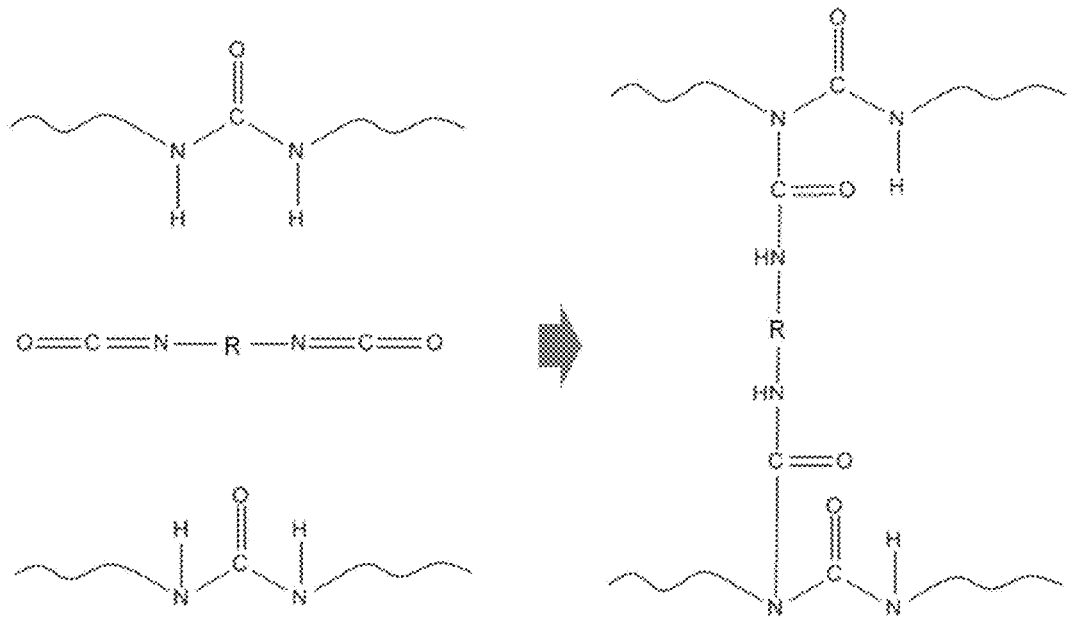

[Fig. 2a]
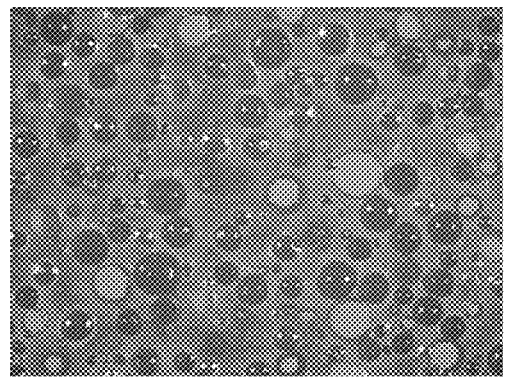
[Fig. 2b]
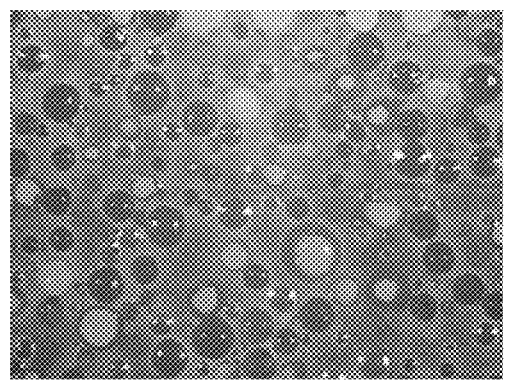
[Fig. 2c]
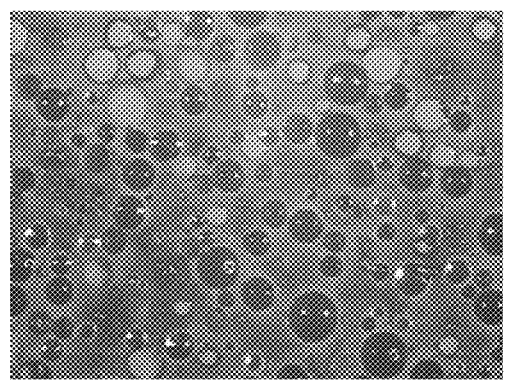

[Fig. 3a]
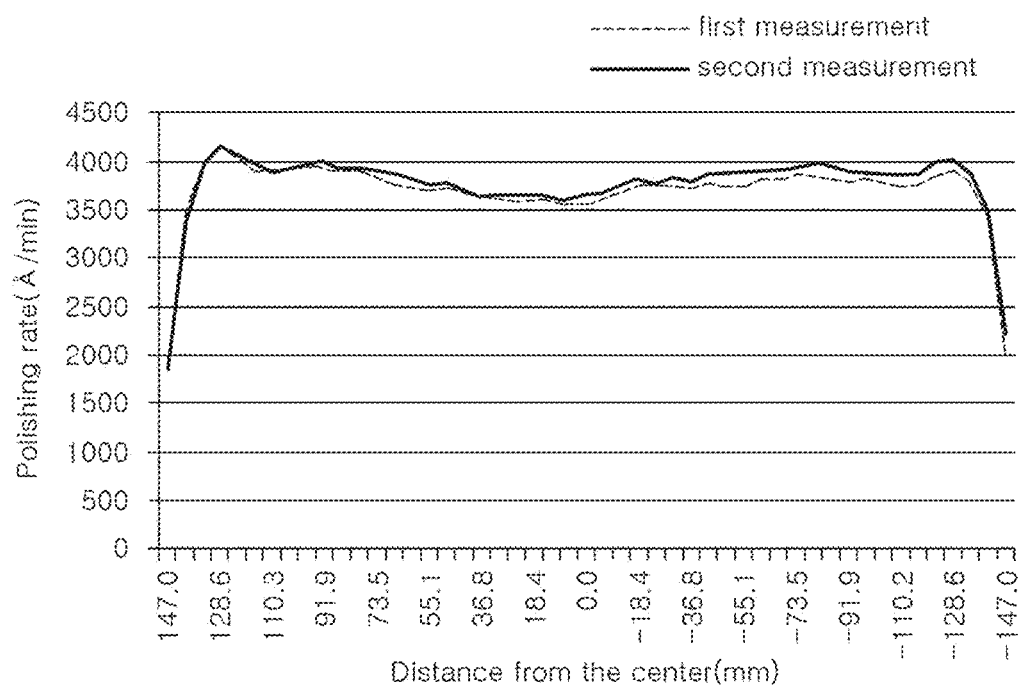

[Fig. 3b]
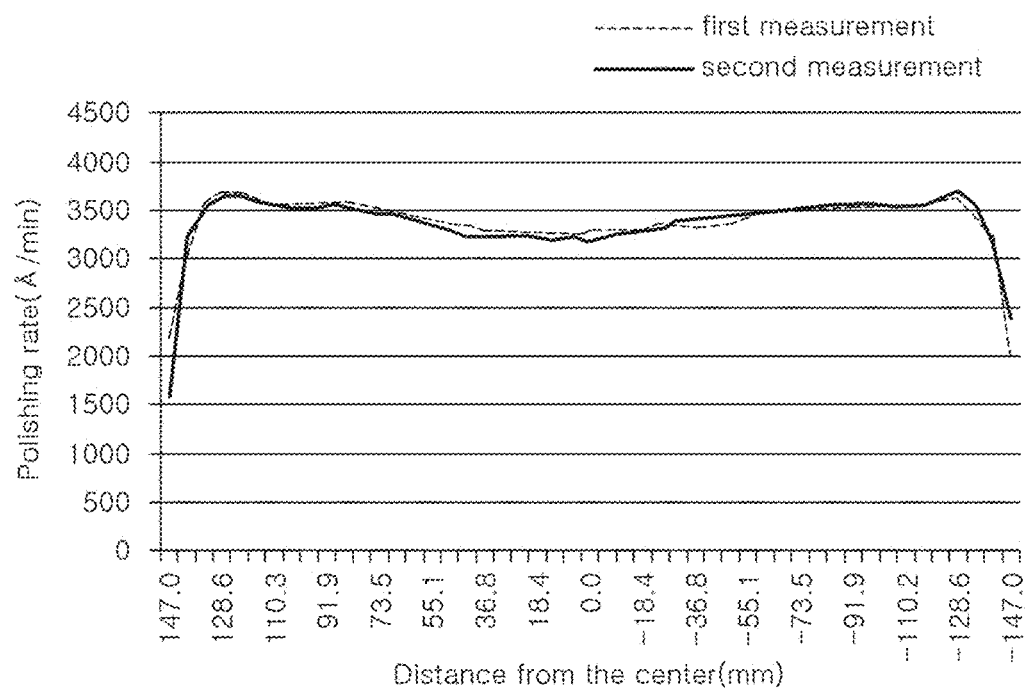

[Fig. 3c]
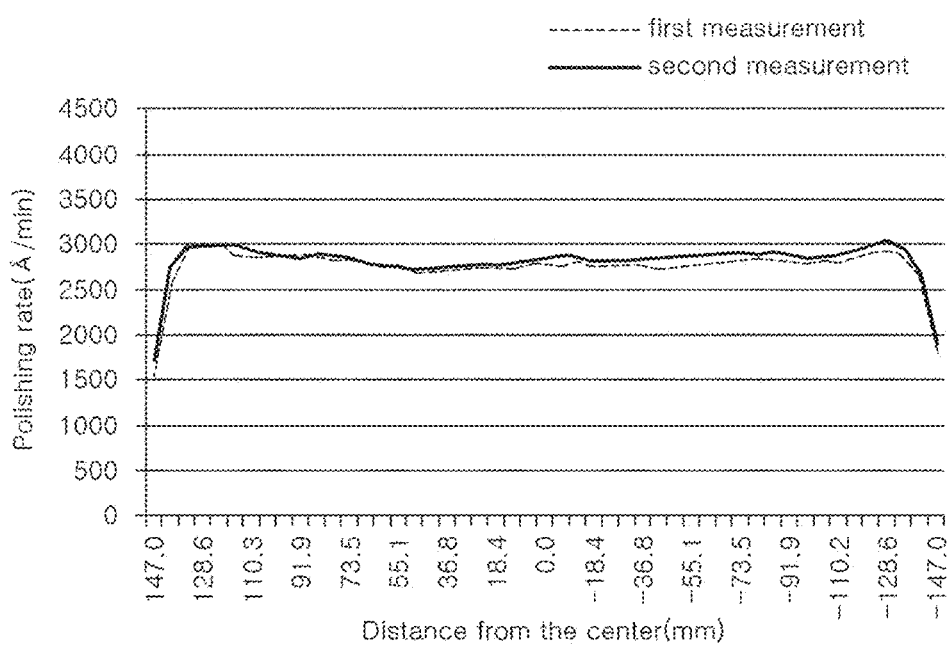

POLISHING PAD WITH IMPROVED CROSSLINKING DENSITY AND PROCESS FOR PREPARING THE SAME

The present application claims priority of Korean patent application number 10-2019-0059632 filed on May 21, 2019, which is incorporated herein by reference in its entirety.

TECHNICAL FIELD

The present invention relates to a polishing pad with an improved crosslinking density and a process for preparing the same. More specifically, the present invention relates to a polishing pad whose crosslinking density is adjusted to have properties and performance applicable to a chemical mechanical planarization (CMP) process, a process for preparing the same, and a process for preparing a semiconductor device by using the same.

BACKGROUND ART

The chemical mechanical planarization (CHIP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad is composed of a polyurethane resin, which is prepared from a composition comprising a prepolymer obtained by reacting a diisocyanate monomer and a polyol, a curing agent, a foaming agent, and the like.

In addition, a polishing pad is provided on its surface with grooves for a large flow of a shiny and pores for supporting a fine flow thereof. The pores may be formed by using a solid phase foaming agent having voids, an inert gas, a liquid phase material, a fiber, or the like, or by generating a gas by a chemical reaction.

Meanwhile, the performance of a polishing pad used in the CMP process is known to be affected by the composition of a polyurethane resin constituting the polishing pad, the diameter of micropores, and such physical properties as hardness, tensile strength, and elongation of the polishing pad.

Thus, attempts have been made to improve the performance of a polishing pad by adjusting the composition and physical properties of these raw materials, failing to provide a solution that can control the polishing rate and pad cut rate of the polishing pad in the most direct way.

DISCLOSURE OF THE INVENTION

Technical Problem

An object of the present invention is to provide a polishing pad whose crosslinking density is adjusted to enhance the performance of the CMP process such as polishing rate and cut pad rate.

Another object of the present invention is to provide a process for preparing the polishing pad.

Still another object of the present invention is to provide a process for preparing a semiconductor device by using the polishing pad.

Solution to the Problem

The present invention provides a polishing pad, which comprises a polishing layer comprising a porous polyurethane-based resin, wherein the polishing layer has a swelling ratio of 100% to 350% in dimethylformamide (DMF) based on the volume or weight of the polishing layer.

The present invention provides a process for preparing a polishing pad, which comprises preparing a first raw material composition comprising a urethane-based prepolymer; preparing a second raw material composition comprising a curing agent; preparing a third raw material composition comprising a foaming agent; sequentially or simultaneously mixing the first raw material composition with the second raw material composition and the third raw material composition to prepare a raw material mixture; and injecting the raw material mixture into a mold preheated to a temperature of 50° C. or higher and curing it to obtain a polishing layer, wherein the polishing layer has a swelling ratio of 100% to 350% in DMF based on the volume or weight of the polishing layer.

The present invention provides a process for preparing a semiconductor device, which comprises polishing the surface of a semiconductor substrate using a polishing pad, wherein the polishing pad comprises a polishing layer comprising a porous polyurethane-based resin, and the polishing layer has a swelling ratio of 100% to 350% in DMF based on the volume or weight of the polishing layer.

Advantageous Effects of the Invention

In the polishing pad according to the embodiment, its crosslinking density is adjusted to enhance the CMP performance such as polishing rate and cut pad rate.

In addition, in the process for preparing a polishing pad according to the embodiment, it is possible to implement such a crosslinking density by a simple method of controlling the preheating temperature of the mold for curing.

Accordingly, the polishing pad may be applied to a process of preparing a semiconductor device, which comprises a CMP process, to provide a semiconductor device of excellent quality.

BRIEF DESCRIPTION OF THE DRAWINGS

FIGS. 1a and 1b illustrate crosslinking reactions taking place in the process of preparing a polishing pad according to one embodiment.

FIGS. 2a, 2b, and 2c are scanning electron microscope (SEM) images of pores in the polishing pads obtained in Examples 1 and 2 and Comparative Example 1, respectively.

FIGS. 3a, 3b, and 3c show the polishing rates (or removal rates) of the polishing pads of Examples 1 and 2 and Comparative Example 1, respectively.

BEST MODE FOR CARRYING OUT THE INVENTION

Hereinafter, the present invention will be described in detail.

In the description of the following embodiments, in the case where each layer, pad, or sheet is mentioned to be formed "on" or "under" another layer, pad, or sheet, it means not only that one element is "directly" formed on or under another element, but also that one element is "indirectly" formed on or under another element with other element(s) interposed between them.

In addition, all numerical ranges related to the physical properties, dimensions, and the like of a component used herein are to be understood as being modified by the term "about," unless otherwise indicated.

Polishing Pad

The polishing pad according to one embodiment comprises a polishing layer comprising a porous polyurethane-based resin, wherein the polishing layer has a swelling ratio of 100% to 350% in dimethylformamide (DMF) based on the volume or weight of the polishing layer.

In the polishing pad according to the embodiment, its crosslinking density is adjusted to enhance the CMP performance such as polishing rate and cut pad rate.

The crosslinking density may be implemented by adjusting the swelling ratio of the polishing layer of the polishing pad in a specific solvent.

Swelling Ratio in DMF

It is possible to more effectively implement the crosslinking density of a polyurethane-based resin, which is closely related to the properties of a polishing pad that affect its CMP performance, by adjusting the swelling ratio of the polishing layer in various organic solvents, especially in dimethylformamide (DMF).

The polishing layer may have a swelling ratio of 100% to 350%, 150% to 350%, 200% to 350%, 100% to 300%, 100% to 250%, 150% to 300%, or 200% to 300%, in DMF based on the volume or weight of the polishing layer.

Specifically, the polishing layer may have a swelling ratio of 150% to 300%, 200% to 300%, 150% to 250%, 200% to 250%, or 150% to 200%, in DMF based on the volume of the polishing layer.

In addition, the polishing layer may have a swelling ratio of 200% to 350%, 250% to 350%, 200% to 300%, 200% to 250%, or 250% to 300%, in DMF based on the weight of the polishing layer.

More specifically, the polishing layer may have a swelling ratio of 150% to 300% in DMF based on the volume of the polishing layer and a swelling ratio of 200% to 350% in DMF based on the weight of the polishing layer.

Swelling Ratio in NMP

It is possible to more effectively implement the crosslinking density of a polyurethane-based resin, which is closely related to the properties of a polishing pad that affect its CMP performance, by adjusting the swelling ratio of the polishing layer in N-methyl-2-pyrrolidone (NMP) in addition to its swelling ratio in DMF.

In addition, the polishing layer may have a swelling ratio of 150% to 450%, 200% to 450%, 250% to 450%, 150% to 400%, 150% to 350%, 200% to 400%, or 250% to 400%, in NMP based on the volume or weight of the polishing layer.

Specifically, the polishing layer may have a swelling ratio of 200% to 350%, 250% to 350%, 200% to 300%, 300% to 350%, or 250% to 300%, in NMP based on the volume of the polishing layer.

In addition, the polishing layer may have a swelling ratio of 300% to 450%, 350% to 450%, 300% to 400%, 350% to 400%, or 300% to 350%, in NMP based on the weight of the polishing layer.

More specifically, the polishing layer may have a swelling ratio of 200% to 350% in NMP based on the volume of the polishing layer and a swelling ratio of 300% to 450% in NMP based on the weight of the polishing layer.

First Crosslinking Unit

The porous polyurethane-based resin comprises a bonding unit generated by crosslinking, among various chemical structures produced through a urethane-based prepolymerization reaction and a curing reaction, thereby significantly affecting the physical properties of a polishing pad.

As an example, the porous polyurethane-based resin may comprise a first crosslinking unit in which two urethane groups are crosslinked by a diisocyanate.

The urethane group may be a urethane group (—NH—C(=O)—O—) formed by a reaction of an isocyanate (—NCO) group and a hydroxyl (—OH) group in the course of obtaining an urethane-based prepolymer by a reaction of an isocyanate monomer and an alcohol monomer, or in the course of obtaining a polyurethane-based resin by a reaction of the urethane-based prepolymer and an alcohol-based curing agent, for the preparation of the polyurethane-based resin.

The amine (—NH—) group in the urethane group can react with the isocyanate (—NCO) group of an unreacted diisocyanate monomer to connect two urethane groups. As a result, two polymer chains each containing these two urethane groups can be bridged (see FIG. 1a).

Specifically, the first crosslinking unit may comprise a structure of Formula 1.

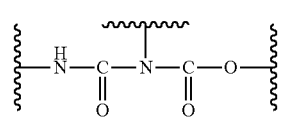

[Formula 1]

Second Crosslinking Unit

As another example, the porous polyurethane-based resin may comprise a second crosslinking unit in which two urea groups are crosslinked by a diisocyanate.

The urea group may be a urea group (—NH—C(=O)—NH—) formed by a reaction of an isocyanate (—NCO) group and an amine (—NH$_2$) group in the course of obtaining a polyurethane-based resin by a reaction of a urethane-based prepolymer and an amine-based curing agent for the preparation of the polyurethane-based resin.

The amine (—NH—) group in the urea group can react with the isocyanate (—NCO) group of an unreacted diisocyanate monomer to connect two urea groups. As a result, two polymer chains each containing these two urea groups can be bridged (see FIG. 1b).

Specifically, the second crosslinking unit may comprise a structure of Formula.

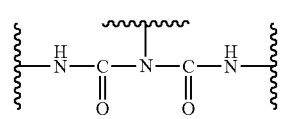

[Formula 2]

In such event, the diisocyanate used in the crosslinking may be at least one aromatic diisocyanate monomer and/or at least one aliphatic diisocyanate monomer. For example, it may be at least one isocyanate selected from the group consisting of toluene diisocyanate (TDI), naphthalene-1,5-diisocyanate, p-phenylene diisocyanate, tolidine diisocyanate, diphenylmethane diisocyanate (MDI), hexamethylene diisocyanate (HDI), dicyclohexylmethane diisocyanate (H12MDI), and isophorone diisocyanate.

In addition, the contents of the first crosslinking unit and the second crosslinking unit may be 1% by weight to 30% by weight, 1% by weight to 20% by weight, 1% by, weight to 10% by weight, or 5% by weight to 20% by weight, based on the weight of the polyurethane resin, respectively.

In addition, the total content of the first crosslinking unit and the second crosslinking unit may be 1% by weight to 60% by weight, 1% by weight to 40% by weight, 1% by weight to 20% by weight, or 10% by weight to 40% by weight, based on the weight of the polyurethane resin.

Characteristics of the Polishing Layer

The thickness of the polishing layer may be 0.8 mm to 5.0 mm, 1.0 mm to 4.0 mm, 1.0 mm to 3.0 mm, 1.5 mm to 2.5 mm, 1.7 mm to 2.3 mm, or 2.0 min to 2.1 mm Within the above range, the basic physical properties as a polishing pad can be sufficiently exhibited while the particle size variation of the micropores between the upper and lower portions is minimized.

The urethane-based prepolymer may have an unreacted NCO group at the terminal of a polymer, oligomer, or monomer contained therein. As a specific example, the urethane-based prepolymer may comprise the unreacted NCO group in an amount of 5% by weight to 15% by weight, 5% by weight to 13% by weight, 7% by weight to 10% by weight, 8% by weight to 10% by weight, based on the weight of the urethane-based prepolymer.

The hardness of the polishing pad may be 50 Shore D to 70 Shore D, 50 Shore D to 60 Shore D, 60 Shore D to 70 Shore D, or 55 Shore D to 65 Shore D. For example, the hardness of the polishing layer may be measured at room temperature.

The tensile strength of the polishing pad may be 5 N/mm$^2$ to 30 N/mm$^2$, 10 N/mm$^2$ to 25 N/mm$^2$ 10 N/mm$^2$ to 20 N/mm$^2$ or 15 N/mm$^2$ to 30 N/mm$^2$.

The elongation of the polishing pad may be 50% to 300%, 100% to 300%, 150% to 250%, or 100% to 200%.

The modulus of the polishing pad may be 30 kgf/cm$^2$ to 100 kgf/cm$^2$, 50 kgf/cm$^2$ to 100 kgf/cm$^2$, 30 kgf/cm$^2$ to 70 kgf/cm$^2$, or 40 kgf/cm$^2$ to 80 kgf/cm$^2$.

Specifically, the polishing pad may have an elongation of 100% to 120% and a modulus of 30 kgf/cm$^2$ to 100 kgf/cm$^2$.

The polishing pad may have a polishing rate (or removal rate) of 700 Å/min. or more against a tungsten layer.

Specifically, the polishing pad may have a polishing rate (or removal rate) of 3,000 Å/min to 4,000 Å/min against a silicon oxide layer.

The pad cut rate of the polishing pad may be 40 μm/hr to 60 μm/hr, 40 μm/hr to 50 μm/hr, 40 μm/hr to 45 μm/hr, or 45 μm/hr to 60 μm/hr.

Support Layer

In addition, the polishing pad may further comprise a support layer disposed on one side of the polishing layer.

The support layer serves to support the polishing layer and to absorb and disperse an impact applied to the polishing layer. Thus, the hardness of the support layer may be smaller than the hardness of the polishing layer.

The support layer may be in a porous structure containing micropores. For example, the support layer may be composed of a nonwoven fabric or a suede.

Adhesive Layer

The polishing pad may further comprise an adhesive layer interposed between the polishing layer and the support layer.

The adhesive layer serves to adhere the polishing layer and the support layer to each other.

The adhesive layer may comprise a hot melt adhesive. The hot melt adhesive may be at least one selected from the group consisting of a polyurethane resin, a polyester resin, an ethylene-vinyl acetate resin, a polyamide resin, and a polyolefin resin. Specifically, the hot melt adhesive may be at least one selected from the group consisting of a polyurethane resin and a polyester resin.

Process for Preparing a Polishing Pad

The process for preparing a polishing pad according to one embodiment comprises preparing a first raw material composition comprising a urethane-based prepolymer; preparing a second raw material composition comprising a curing agent; preparing a third raw material composition comprising a foaming agent; sequentially or simultaneously mixing the first raw material composition with the second raw material composition and the third raw material composition to prepare a raw material mixture; and injecting the raw material mixture into a mold preheated to a temperature of 50° C.; or higher and curing it to obtain a polishing layer; wherein the polishing layer has a swelling ratio of 100% to 350% in DMF based on the volume or weight of the polishing layer.

Step of Preparing the First Raw Material Composition

The prepolymer contained in the first raw material composition generally refers to a polymer having a relatively low molecular weight wherein the degree of polymerization is adjusted to an intermediate level for the sake of conveniently molding a product in the process of producing the same. For example, the weight average molecular weight (Mw) of the urethane-based prepolymer may be 500 g/mole to 3,000 g/mole, 600 g/mole to 2,000 g/mole, or 700 g/mole to 1,500 g/mole. A prepolymer may be molded by itself, or after a further reaction with another polymerizable compound or a curing agent, to form a final product.

The urethane-based prepolymer comprises a prepolymerization reaction product of at least one diisocyanate monomer and at least one polyol.

The at least one diisocyanate monomer may be at least one aromatic diisocyanate monomer and/or at least one aliphatic diisocyanate monomer. For example, it may be at least one isocyanate selected from the group consisting of toluene diisocyanate (TDI), naphthalene-1,5-diisocyanate, p-phenylene diisocyanate, tolidine diisocyanate, diphenylmethane diisocyanate (MDI), hexamethylene diisocyanate (HDI), dicyclohexylmethane diisocyanate (H12MDI), and isophorone diisocyanate.

Step of Preparing the Second Raw Material Composition

The curing agent contained in the second raw material composition may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine (DETDA), diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, and trimethylolpropane.

Step of Preparing the Third Raw Material Composition

The foaming agent contained in the third raw material composition is not particularly limited as long as it is commonly used for forming voids in a polishing pad.

For example, the foaming agent may be at least one selected from a solid phase foaming agent having a hollow structure, a liquid phase foaming agent using a volatile liquid, and an inert gas.

The solid phase foaming agent may be thermally expanded microcapsules. They may be obtained by thermally expanding thermally expandable microcapsules. Since the thermally expanded microcapsules in a structure of already expanded micro-balloons have a uniform particle diameter, they have the advantage that the diameter of pores can be controlled to be uniform. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1 part by weight to 2 parts by weight based on 100 parts by weight of the urethane-based prepolymer. Specifically, the solid phase foaming agent may be employed in an amount of 0.3 parts by weight to 1.5 parts by weight or 0.5 parts by weight to 1.0 parts by weight, based on 100 parts by weight of the urethane-based prepolymer.

The kind of the inert gas is not particularly limited as long as it is a gas that does not participate in the reaction between the urethane-based prepolymer and the curing agent. For example, the inert gas may be at least one selected from the group consisting of nitrogen gas ($N_2$), carbon dioxide ($CO_2$), argon gas (Ar), and helium (He). Specifically, the inert gas may be nitrogen gas ($N_2$) or carbon dioxide ($CO_2$).

The inert gas may be fed in a volume of 10% to 30% based on the total volume of the polyurethane composition. Specifically, the inert gas may be fed in a volume of 15% to 30% based on the total volume of the polyurethane composition.

Step of Preparing the Raw Material Mixture

In addition, the step of preparing the raw material mixture may be carried out by mixing the first raw material composition with the second raw material composition, followed by further mixing thereof with the third raw material composition, or by mixing the first raw material composition with the third raw material composition, followed by further mixing thereof with the second raw material composition.

In addition, the step of preparing the raw material mixture may be carried out under the condition of 50° C. to 150° C. If necessary, it may be carried out under vacuum defoaming conditions.

Each raw material component in the raw material mixture thus obtained may have an equivalent ratio adjusted for the reaction.

The urethane-based prepolymer and the curing agent may be employed at a molar equivalent ratio of 1:0.8 to 1:1.2 based on the number of moles of the reactive groups in each molecule.

In addition, the urethane-based prepolymer is prepared by a prepolymerization reaction of at least one diisocyanate monomer and at least one polyol. In such event, the at least one diisocyanate monomer and the at least one polyol may be employed at a molar equivalent ratio of 1:0.8 to 1:1.2 based on the number of moles of the reactive groups in each molecule.

In addition, a crosslinking agent having three or more reactive groups in the molecule may not be added to the raw material mixture.

Step of Obtaining a Polishing Layer

Thereafter, the raw material mixture is injected into a mold and cured to obtain a polishing layer.

In such event, the crosslinking density can be controlled by injecting the raw material mixture into a mold preheated to a temperature of 50° C. or higher and curing it. Specifically, when the preheating temperature of the mold is 50° C. or higher, the bonding units generated by crosslinking may be sufficiently contained in the polyurethane-based resin. As a result, the polishing layer may have a swelling ratio of 150% to 300% in DMF based on the volume or weight of the polishing layer. In contrast, if the preheating temperature of the mold is less than 50° C., the crosslinking density may be insufficient and the swelling ratio in DMF may be greater than 350%. More specifically, the preheating temperature of the mold may be 50° C. to 150° C., 50° C. to 100° C., 100° C. to 150° C., or 70° C. to 120° C.

In such event, the preheating temperature of the mold should be distinguished from the temperature of the subsequent curing step, and there may be no particular relationship between them. That is, unlike the preheating temperature of the mold, the curing temperature may not affect the crosslinking density of the polyurethane-based resin. The curing step may be carried out under the temperature condition of 60° C. to 120° C. and the pressure condition of 50 $kg/m^2$ to 200 $kg/m^2$.

In addition, the above preparation process may further comprise the steps of cutting the surface of a polishing pad thus obtained, machining grooves on the surface thereof, bonding with the lower part, inspection, packaging, and the like. These steps may be carried out in a conventional manner for preparing a polishing pad.

In the polishing pad thus prepared, its crosslinking density is adjusted to enhance the CMP performance such as polishing rate and cut pad rate. In addition, as described above, it is possible to implement such a crosslinking density by a simple method of controlling the preheating temperature of the mold for curing.

Process for Preparing a Semiconductor Device

The process for preparing a semiconductor device according to one embodiment comprises polishing the surface of a semiconductor substrate using the polishing pad according to the embodiment.

That is, the process for preparing a semiconductor device according to one embodiment comprises polishing the surface of a semiconductor substrate using a polishing pad, wherein the polishing pad comprises a polishing layer comprising a porous polyurethane-based resin, and the polishing layer has a swelling ratio of 100% to 350% in DMF based on the volume or weight of the polishing layer.

Specifically, once the polishing pad according to the embodiment is attached to a platen, a semiconductor substrate is disposed on the polishing pad. In such event, the surface of the semiconductor substrate is in direct contact with the polishing surface of the polishing pad. A polishing slurry may be sprayed on the polishing pad for polishing. Thereafter, the semiconductor substrate and the polishing pad rotate relatively to each other, so that the surface of the semiconductor substrate is polished.

EMBODIMENTS FOR CARRYING OUT THE INVENTION

Hereinafter, the present invention will be described in detail with reference to examples. These examples are set forth to illustrate the present invention, and the scope of the present invention is not limited thereto.

Example 1

A four-necked flask was charged with toluene diisocyanate (TDI), dicyclohexylmethane diisocyanate (H12MDI), polytetramethylene ether glycol (PTMEG), and diethylene glycol (DEG), followed by a reaction thereof at 80° C. for 3 hours, thereby preparing a urethane-based prepolymer having a content of unreacted NCO group (NCO %) of 8% by weight.

A casting machine equipped with tanks and feeding lines for a prepolymer, a curing agent, an inert gas, and a foaming agent was provided. The urethane-based prepolymer prepared above, a curing agent (4,4'-methylenebis(2-chloroaniline) (MOCA), Ishihara), an inert gas ($N_2$), a liquid phase foaming agent (FC3283, 3M), a solid phase foaming agent (Akzonobel), and a silicone-based surfactant (Evonik) were charged to each tank. The raw materials were stirred while they were fed to the mixing head at constant rates through the respective feeding lines. In such event, the prepolymer and the curing agent were fed at an equivalent ratio of 1:1 and at a total rate of 10 kg/min.

A mold (1,000 mm×1,000 mm×3 mm) was prepared and preheated to a temperature as shown in the following table. The mixed raw materials prepared above were injected into the mold and reacted to obtain a molded article in the form of a solid cake, Thereafter, the top and bottom of the molded article were each ground to obtain a polishing layer.

Thereafter, the polishing layer was subjected to surface milling and groove forming steps and laminated with a support layer by a hot melt adhesive.

Example 2

The same procedures as in Example 1 were carried out except that the specific process conditions were changed as shown in Table 1 below.

Comparative Example 1

The same procedures as in Example 1 were carried out except that the specific process conditions were changed as shown in Table 1 below.

Specific process conditions for the Examples and Comparative Examples are summarized in the following table.

TABLE 1

| | Item | Ex. 1 | Ex. 2 | C. Ex. 1 |
|---|---|---|---|---|
| Polishing layer | NCO % of prepolymer | 8% by weight | 8% by weight | 8% by weight |
| | Casting mold | Single layer | Single layer | Single layer |
| | Mold preheating temp. | 120° C. | 80° C. | Room temp. |
| | Casting, cutting, and grooving | sequential | sequential | sequential |
| | Prepolymer (part by weight) | 100 | 100 | 100 |
| | Surfactant (part by weight) | 0.2 to 1.5 | 0.2 to 1.5 | 0.2 to 1.5 |
| | Solid phase foaming agent (part by weight) | 0.5 to 1.0 | 0.5 to 1.0 | 0.5 to 1.0 |
| | Inert gas feeding rate (l/min) | 0.5 to 1.5 | 0.5 to 1.5 | 0.5 to 1.5 |

Test Example

The urethane-based prepolymers or the polishing pads obtained in the Examples and Comparative Example were tested for the following items.

(1) Swelling Ratio

The polishing layer before the formation of grooves was cut into a diameter of 20 mm and a thickness of 2 mm to prepare a sample. The precise size of the sample thus prepared was measured using a vernier caliper. The sample was weighed using a valid scale with four decimal places. A 50-ml beaker was charged with a solvent (DMF or NMP), and the sample was placed therein and stored at room temperature (20 to 25° C.) for 24 hours. Thereafter, the sample was taken out, and DMF or NMP remaining on the surface thereof was wiped 2 to 3 times using gauze. Then, the sample was measured for the size and weight. The swelling ratio (%) was calculated by the following equation.

Swelling ratio (%, volume)=(volume after storage in solvent−initial volume)/initial volume×100

Swelling ratio (%, weight)=(weight after storage in solvent−initial weight)/initial weight×100

TABLE 2

| Item | Ex. 1 | Ex. 2 | C. Ex. 1 |
|---|---|---|---|
| Swelling ratio in DMF (based on volume) | 191% | 220% | 301% |
| Swelling ratio in DMF (based on weight) | 242% | 261% | 364% |
| Swelling ratio in NMP (based on volume) | 270% | 294% | 364% |
| Swelling ratio in NMP (based on weight) | 353% | 389% | 454% |

(2) Hardness

Each sample was cut to 5 cm×5 cm (thickness: 2 mm) and stored at room temperature and a temperature of 30° C., 50° C., and 70° C., respectively, for 12 hours to measure the Shore D hardness and Asker C hardness using a hardness tester.

(3) Specific Gravity

Each sample was cut to 2 cm×5 cm (thickness: 2 mm) and stored at a temperature of 25° C. for 12 hours to measure the specific gravity using a gravimeter.

(4) Tensile Strength

Each sample was cut to 0.4 cm×1 cm (thickness: 2 mm) The ultimate strength immediately before the fracture was measured while the sample was tested at a rate of 50 mm/min using a universal testing machine (UTM).

(5) Elongation

Each sample was cut to 4 cm×1 cm (thickness: 2 mm). The maximum deformation immediately before the fracture was measured while the sample was tested at a rate of 50 nim/min using a universal testing machine (UTM). The ratio of the maximum deformation to the initial length was expressed in percent (%).

(6) Modulus

Each sample was cut to 4 cm×1 cm (thickness: 2 mm). The modulus was measured as the slope between the elongation at 70% and the elongation at 20% while the sample was tested at a rate of 50 mm/min using a universal testing machine (UTM).

TABLE 3

| Item | Evaluation | Ex. 1 | Ex. 2 | C. Ex. 1 |
|---|---|---|---|---|
| Polishing layer | Thickness (mm) | 2 | 2 | 2 |
| | Hardness (Shore D, room temp.) | 61.3 | 59.3 | 57 |
| | Specific gravity (g/cc) | 0.82 | 0.81 | 0.81 |
| | Tensile strength (N/mm$^2$) | 22.3 | 22.2 | 22 |
| | Elongation (%) | 107.5 | 103.7 | 98.2 |
| | Modulus (kgf/cm$^2$) | 43.1 | 72.4 | 130 |
| | Hardness (Shore D, 30° C.) | 61.4 | 58.1 | 50.8 |
| | Hardness (Shore D, 50° C.) | 59.6 | 56.7 | 50 |
| | Hardness (Shore D, 70° C.) | 57.2 | 54.2 | 48.8 |
| Support layer | Type | Nonwoven fabric | Nonwoven fabric | Nonwoven fabric |
| | Thickness (mm) | 1.1 | 1.1 | 1.1 |
| | Hardness (Asker C) | 70 | 70 | 70 |
| Laminated pad | Thickness (mm) | 3.32 | 3.32 | 3.32 |
| | Compression rate (%) | 1.05 | 1.05 | 1.05 |

As shown in the above table, the polishing pads of Examples 1 and 2 were excellent in hardness, tensile strength, elongation, and modulus.

(7) Pore Characteristics

The pores of the polishing pads of Examples 1 and 2 and Comparative Example 1 were observed by scanning electron microscopy (SEM) and are shown in FIGS. 2a, 2b, and 2c, respectively. As shown in FIGS. 2a and 2b, the pores in the polishing pads of Examples 1 and 2 were finely and uniformly distributed over a large area.

In addition, the pore characteristics of the pores were calculated based on the SEM images and summarized in the table below.

Number average diameter: average of the sum of the pore diameters divided by the number of pores on the SEM image Number of pores: Number of pores per 0.3 cm$^3$ on the SEM image Pore area ratio: percentage of the area of the pores relative to the total area of the SEM image

TABLE 4

| Item | Ex. 1 | Ex. 2 | C. Ex. 1 |
|---|---|---|---|
| Number average diameter (μm) | 22.2 | 23.1 | 23.6 |
| Number of pores (per 0.3 cm$^3$) | 195 | 183 | 166 |
| Pore area ratio (%) | 44.06 | 41.65 | 39.72 |

(8) Polishing Rate

The initial polishing late immediately after the polishing pad had been prepared was measured as follows.

A silicon wafer having a diameter of 300 mm was deposited with silicon oxide by a CVD process. The polishing pad was mounted on a CMP machine, and the silicon wafer was set with the silicon oxide layer thereof facing the polishing surface of the polishing pad. The silicon oxide layer was polished under a polishing load of 4.0 psi while it was rotated at a speed of 150 rpm for 60 seconds and a calcined silica slurry was supplied onto the polishing pad at a rate of 250 Upon completion of the polishing, the silicon wafer was detached from the carrier, mounted in a spin dryer, washed with distilled water, and then dried with nitrogen for 15 seconds. The changes in the film thickness of the dried silicon wafer before and after the polishing were measured using a spectral reflectometer type thickness measuring instrument (SI-F80R, Kyence). The polishing rate was calculated using the following Equation.

Polishing rate (Å/min)=polished thickness of a silicon wafer (Å)/polishing time (minute)

The polishing rates of the polishing pads of Examples 1 and 2 and Comparative Example 1 were measured twice, respectively, and are shown in FIGS. 3a to 3c, respectively.

(9) Pad Cut Rate

Each polishing pad was pre-conditioned with deionized water for 10 minutes and then conditioned while deionized water was sprayed for 1 hour. The change in thickness of the polishing pad during the conditioning was measured to calculate the pad cut rate. The equipment used for conditioning was CTS AP-300HM. The conditioning pressure was 6 lbf, the rotational speed was 100 to 110 rpm, and the disk used for conditioning was Sasol LPX-DS2.

TABLE 5

| Item | Ex. 1 | Ex. 2 | C. Ex. 1 |
|---|---|---|---|
| Avg. polishing rate (Å/min) | 3724 | 3357 | 2809 |
| Pad cut rate (μm/hr) | 51.3 | 43.3 | 39.3 |

As shown in the above table and FIGS. 3a to 3c, the polishing pads of Examples 1 and 2 were excellent in polishing rate and pad cut rate.

The invention claimed is:

1. A polishing pad, which comprises a polishing layer comprising a porous polyurethane-based resin, wherein the polishing layer has a swelling ratio of 100% to 350% in dimethylformamide (DMF) based on the volume or weight of the polishing layer, and the polishing layer has a swelling ratio of 150% to 450% in N-methyl-2-pyrrolidone (NMP) based on the volume or weight of the polishing layer, when the polishing layer is stored in each of DMF and NMP at room temperature for 24 hours.

2. The polishing pad of claim 1, wherein the polishing layer has a swelling ratio of 150% to 300% in DMF based on the volume of the polishing layer and a swelling ratio of 200% to 350% in DMF based on the weight of the polishing layer.

3. The polishing pad of claim 1, wherein the polishing layer has a swelling ratio of 200% to 350% in NMP based on the volume of the polishing layer and a swelling ratio of 300% to 450% in NMP based on the weight of the polishing layer.

4. The polishing pad of claim 1, wherein the porous polyurethane-based resin comprises a first crosslinking unit in which two urethane groups are crosslinked by a diisocyanate.

5. The polishing pad of claim 4, wherein the first crosslinking unit comprises a structure of Formula 1:

[Formula 1]

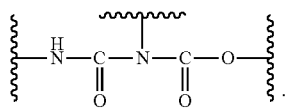

6. The polishing pad of claim 1, wherein the porous polyurethane-based resin comprises a second crosslinking unit in which two urea groups are crosslinked by a diisocyanate.

7. The polishing pad of claim 6, wherein the second crosslinking unit comprises a structure of Formula 2:

[Formula 2]

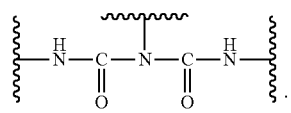

8. The polishing pad of claim 1, wherein the polishing layer has an elongation of 100% to 120% and a modulus of 30 kgf/cm$^2$ to 100 kgf/cm$^2$.

9. The polishing pad of claim 1, wherein the polishing layer has a polishing rate (or removal rate) of 3,000 Å/min to 4,000 Å/min against a silicon oxide layer.

10. A process for preparing a semiconductor device, which comprises polishing the surface of a semiconductor substrate using a polishing pad, wherein the polishing pad comprises a polishing layer comprising a porous polyurethane-based resin, and the polishing layer has a swelling ratio of 100% to 350% in dimethylformamide (DMF) based on the volume or weight of the polishing layer, and wherein the polishing layer has a swelling ratio of 150% to 450% in N-methyl-2-pyrrolidone (NMP) based on the volume or weight of the polishing layer, when the polishing layer is stored in each of DMF and NMP at room temperature for 24 hours.

* * * * *